(12) United States Patent
Despa et al.

(10) Patent No.: US 8,076,057 B2
(45) Date of Patent: Dec. 13, 2011

(54) METHODS OF MAKING EXTRUSION DIES

(75) Inventors: Mircea Despa, Horseheads, NY (US);
Dale Russell Hess, Corning, NY (US);
Kenneth Richard Miller, Addison, NY (US); Christine Marie Share, Macedon, NY (US)

(73) Assignee: Corning Incorporated, Corning, NY (US)

( * ) Notice: Subject to any disclaimer, the term of this patent is extended or adjusted under 35 U.S.C. 154(b) by 907 days.

(21) Appl. No.: 12/148,208

(22) Filed: Apr. 17, 2008

(65) Prior Publication Data

US 2009/0220633 A1    Sep. 3, 2009

Related U.S. Application Data

(60) Provisional application No. 61/067,748, filed on Feb. 29, 2008.

(51) Int. Cl.
*G03F 7/20* (2006.01)

(52) U.S. Cl. ........................................ 430/320; 430/324

(58) Field of Classification Search ........................ None
See application file for complete search history.

(56) References Cited

U.S. PATENT DOCUMENTS

| | | | |
|---|---|---|---|
| 5,190,637 A | 3/1993 | Guckel | 5/2 |
| 6,517,665 B1 | 2/2003 | Boehme et al. | |
| 6,989,119 B2 | 1/2006 | Bernas et al. | 47/12 |
| 2005/0266262 A1* | 12/2005 | Bonhote et al. | 428/621 |
| 2007/0227893 A1 | 10/2007 | Saucy | 5/2 |

OTHER PUBLICATIONS

E. W. Becker et al., *Fabrication of microstructures with high aspect ratios and great structural heights by synchrotron radiation lithography, galvanoforming, and plastic moulding (LIGA process)*, Microelectronic Engineering, vol. 4, No., pp. 35-36 (May 1, 1986).
Ranjett B. Rao, et al., *Microfabricated deposition nozzles for direct-write assembly of three-dimensional periodic structures*, Advanced Materials, vol. 17, No. 3, pp. 289-293 (Feb. 10, 2005).
Yuhua Guo, et al., *Investigation on overplating high-aspect-ratio microstructure*, Proceedings of SPIE—The International Society for Optical Engineering 2006, vol. 6109, pp. 61090M-1-8 (2006).
"Amorphous Chalcogenide Inorganic Resist", Akira Yoshikawa, Journal of Photopolymer Science and Technology, vol. 7, No. 3 (1994), pp. 577-584.
"Micro-Extrusion of Amorphous Alloy with Micro Die Fabricated by UV-LIGA Process", Kurosawa et al., The Japan Society of Mechanical Engineers, NII-Electronic Library Service, 2000, pp. 249-250.
"Inorganic Resist Phenomena and Their Applications to Projection Lithography", Leung et al., IEEE Transactions on Electron Devices, vol. ED-33, No. 2, 1986, pp. 173-181.
"Development of Inorganic Resists for Electron Beam Lithography: Novel Materials and Simulations", Augustin Jeyakumar, A Thesis Presented to the Academic Faculty of the School of Chemical & Bimolecular Engineering, Georgia Institute of Technology, 2004.
"Chemical and physical aspects of the post-exposure baking process used for positive-tone chemically amplified resists", Hinsberg et al., IBM J. Res. & Dev. vol. 45 No. 5, 2001, pp. 667-682.

* cited by examiner

*Primary Examiner* — John A. McPherson
(74) *Attorney, Agent, or Firm* — Tina N. Thompson (57) ABSTRACT

Methods for making extrusion dies using a LIGA process, a German acronym for lithography (Lithographie), electroplating (Galvanoformung), and molding (Abformung), are described. The resulting extrusion dies can be used, for example, for extrusion of cellular ceramic substrates, precision extrusion of optical fiber or optical fiber precursors, or other applications where profile extrusion requires high dimensional precision and/or has otherwise intricate patterns.

17 Claims, 6 Drawing Sheets

METHODS OF MAKING EXTRUSION DIES

This application claims the benefit of priority to provisional application No. 61/067,748, titled "Methods of Making Extrusion Dies," filed on Feb. 29, 2008, the contents of which are incorporated by reference herein in their entirety.

BACKGROUND

1. Field of the Invention

Embodiments of the invention relate to methods of making extrusion dies and more particularly to methods of making extrusion dies utilizing a LIGA process which are useful for forming arbitrary cellular structures.

2. Technical Background

Conventional extrusion dies for forming cellular ceramic products typically have a series of holes on one side of a metal plate intersecting a series of slots, forming pins, which can have various geometric cross sections such as squares, hexagons, or the like on the opposite side of the metal plate. In order to form the cellular ceramic products, raw materials, i.e. batch, is pushed into the hole side of the metal plate and exits the slot side of the metal plate, forming the cellular shape by being extruded through the slots and around the pins.

A similar process can be used to fabricate, for example, optical fiber by extrusion through an extrusion die. In this process, the fiber can be obtained by a draw-down process from a cane which is extruded through a larger size die. The cane and thus fiber cross-section can be cellular and is known as a photonic band-gap design.

A variety of conventional machining methods can be used to create this tooling geometry, depending on dimensions and design of the extrusion dies. For the machining of the holes, drilling, twist drilling, gun drilling and electrochemical machining (ECM) are typically used. For the machining of the slots, abrasive wheel grinding, wire electrical discharge machining (wEDM), wheel slitting and/or plunge electrical discharge machining (pEDM) are typically used. Typically after machining, the surfaces of the extrusion dies are coated with a wear resistant material to improve the life of the extrusion dies.

The conventional machining methods used for making the extrusion dies have several disadvantages, for example, lack of precision of the dimensions of the holes and/or the slots and the increased fabrication time of the extrusion dies. wEDM and pEDM methods can be limited by the precision capabilities of the electrode and also by the constant wear to the electrode realized through the cutting process. Further, wEDM and pEDM are inherently slow when high precision is required, because dimensional tolerance is inversely proportional to the feed speed. In order to reduce these effects, a second, finishing machining pass is required, further slowing the overall fabrication time of the extrusion dies dramatically. In the case of pEDM, the second finishing machining pass usually requires the use of a second electrode, which also increases the fabrication time and costs.

Moreover, the abovementioned methods cannot always be used to make increasingly intricate patterns, irrespective of the precision or speed. For example, a wEDM method could be used to make a fully intersecting pattern made of straight lines, but not a fully intersecting pattern with, for example, hexagonal cells (honeycomb). pEDM has the disadvantage of requiring an electrode to be machined prior to the cutting process. The electrode is typically made using conventional machining (milling) methods or wEDM, which have well known limitations in terms of precision on features below 2 thousandths of an inch in size. Conventional mill and wEDM machining methods have the inability to produce a zero radius of curvature when a finite diameter bit or wire is used which adds to the precision issue in some of the EDM processes.

Similar disadvantages exist in the fabrication of extrusion dies for optical fiber having special cross-sectional designs. In optical fiber fabrication, a cane is not necessarily a cellular shape, but can be a solid shape having a unique cross-sectional geometry. The optical fiber can be drawn-down from the cane. Alternatively, the cane can be extruded directly at the final diameter, in the 100-1000 microns range through an extrusion die. Such small dimensions combined with a complex geometry make the conventional machining methods unusable.

It would be advantageous to have a method for making an extrusion die which possesses high precision of features. It would also be advantageous to have the method applicable to several different slot geometries depending on the intended application. Further, it would be advantageous for the method to be cost effective and reduce manufacturing time.

SUMMARY

Extrusion dies and methods of making extrusion dies, as described herein, address one or more of the above-mentioned disadvantages of extrusion dies and methods of making extrusion dies.

One embodiment of the invention is a method comprising: providing a layer of a resist on a substrate; irradiating a pattern on the resist layer that circumscribes an interconnected network of resist; developing the resist layer to expose the interconnected network of resist; applying a metal layer onto the surface of the substrate where the resist had been developed to form metal pins; and removing the interconnected network of resist, resulting in an interconnected series of slots defined by the metal pins. The method can be used, for example, to make an extrusion die.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings illustrate one or more embodiment(s) of the invention and together with the description serve to explain the principles and operation of the invention.

BRIEF DESCRIPTION OF THE DRAWINGS

The invention can be understood from the following detailed description either alone or together with the accompanying drawing figures.

DETAILED DESCRIPTION

Reference will now be made in detail to various embodiments of the invention, examples of which are illustrated in the accompanying drawings. Wherever possible, the same reference numbers will be used throughout the drawings to refer to the same or like parts.

LIGA is a German acronym for lithography (Lithographie), electroplating (Galvanoformung), and molding (Abformung). LIGA is a process in microtechnology that was developed in the early 1980s. LIGA was one of the first major techniques to allow on-demand manufacturing of high-aspect-ratio structures (structures that are much taller than wide) with lateral precision below one micrometer. The LIGA process is capable of producing very small, precise features using a combination of lithography and electroplating steps. This capability is important in the fabrication, for example, of microelectromechanical (MEMS) devices. In MEMS devices, the LIGA process has been used to create micromachinery components such as gears or levers.

There are several different types of LIGA technologies, differing in the radiation and preform used, for example X-Ray LIGA which uses X-Rays produced by a synchrotron, UV-LIGA which uses ultraviolet light, typically from a mercury lamp, and special resists like SU-8, and Silicon-LIGA which uses deep reactive ion etched silicon as a preform.

Figure 1:
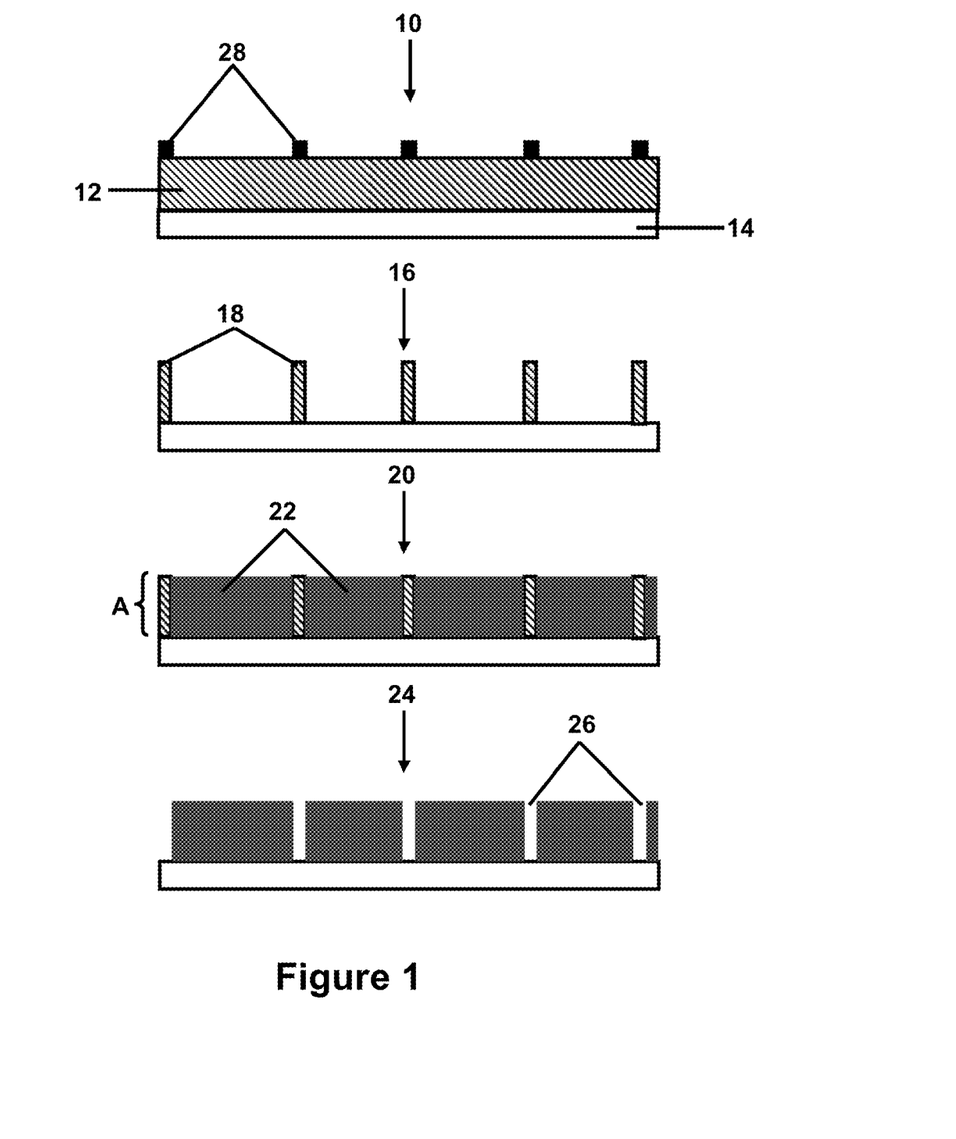
FIG. 1 is a schematic of the method according to one embodiment.
Figure 2:
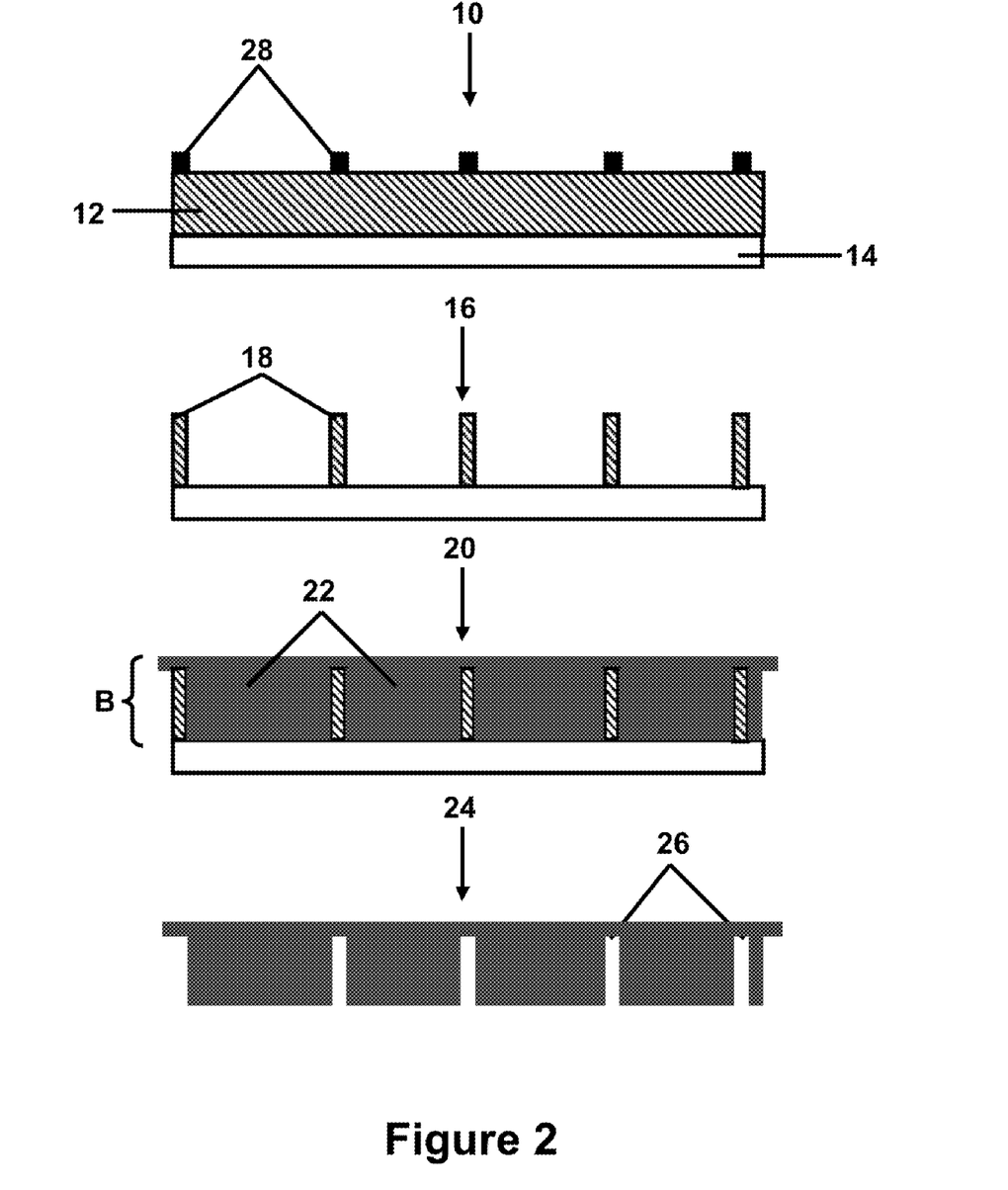
FIG. 2 is a schematic of the method according to one embodiment.

One embodiment of the invention, as shown in FIG. 1 and FIG. 2, is a method comprising providing a layer of resist 12 on a substrate 14, irradiating 10 a pattern on the resist layer that circumscribes an interconnected network of resist, developing 16 the resist layer to expose the interconnected network 18 (shown in cross-section) of resist, applying 20 a metal layer onto the surface of the substrate where the resist had been developed to form metal pins 22; and removing 24 the interconnected network of resist, resulting in an interconnected series of slots 26 defined by the metal pins. The method can be used, for example, to make an extrusion die.

According to one embodiment, the resist is selected from an organic resist, inorganic resist, and combinations thereof. Examples of inorganic resists are Ag/Se—Ge resist, chalcogenide resist, and amorphous glass resists. Examples of organic resists are resists which comprise carbon, oxygen, hydrogen, nitrogen, and/or sulfur. In one embodiment, the organic resist is selected from a photo resist, a polymer resist, and combinations thereof. Polymeric resists can be, for example, acrylates, sulfones, epoxies, and chemically amplified resists.

According to one embodiment, the interconnected network of resist is removed by a process selected from chemical stripping, pyrolysis, molten salt, and combinations thereof. Other removal methods known by those skilled in the art can be used to remove the interconnected network of resist.

One embodiment, as shown in FIG. 1 and FIG. 2, comprises developing the irradiated portion of the resist layer to expose the interconnected network of resist. The resist, in this embodiment, is an organic resist and has a positive tone.

According to one embodiment, shown in FIG. 1, the method comprises applying the metal layer at a thickness A equal to that of the resist layer. In another embodiment, shown in FIG. 2, the method comprises applying the metal layer at a thickness B greater than that of the resist layer. The method further comprises, in one embodiment, shown in FIG. 2, removing the substrate after forming the pins defining an interconnected series of slots. The metal layer can be applied using a plating method, for example, electroplating or electroless plating or other plating methods known by those skilled in the art. Electroplating or electroless plating can be performed according to methods known by those skilled in the art and using materials known by those skilled in the art. The plating material can be selected from Ni, Ni—Co, Ni—Mn, Ni—Mn—Co, Au, Cu, Cr, filled materials, and combinations thereof, for example. Filled materials can be, for example, a fluorocarbon such as Teflon®. Other examples of filler materials are carbon nitride, a carbide compound, for example, silicon carbide, tungsten carbide. Filled materials can be used, for example, for modifying the properties of the plating, for example, for changing lubricity and/or wear resistance of the plating material.

In some embodiments, as shown in FIG. 1 and FIG. 2, a mask 28 is applied to a portion of the resist after providing the layer, wherein the mask defines the pattern of the resist to be irradiated. The mask can be formed using standard lithography techniques. In some embodiments, the mask and the layer of resist can be irradiated to define the interconnected network of resist. The resist has the property of changing solubility when exposed to radiation. The purpose of the mask is to define the desired pattern by blocking the radiation in some areas and letting it through in some other areas. The mask can be removed prior to developing.

The design of the mask can be related to the tone of the resist, for example, when using a positive resist, the mask blocks the irradiation of the resist in the areas corresponding to the interconnected network. When using a negative resist, the mask blocks the irradiation of the resist in the areas corresponding to the pin area.

Alternatively, a maskless method can be used. In one embodiment, the resist is patterned by direct exposure to one or more sources of radiation. A pattern can be made through focused exposure similar to drawing the desired pattern on the resist, for example.

According to some embodiments, the radiation for irradiating, with or without the use of a mask, can be selected from ultra-violet, electron beam, ion beam, proton beam, electromagnetic radiation, X-ray, laser, and combinations thereof, for example.

Figures 3A, 3B:
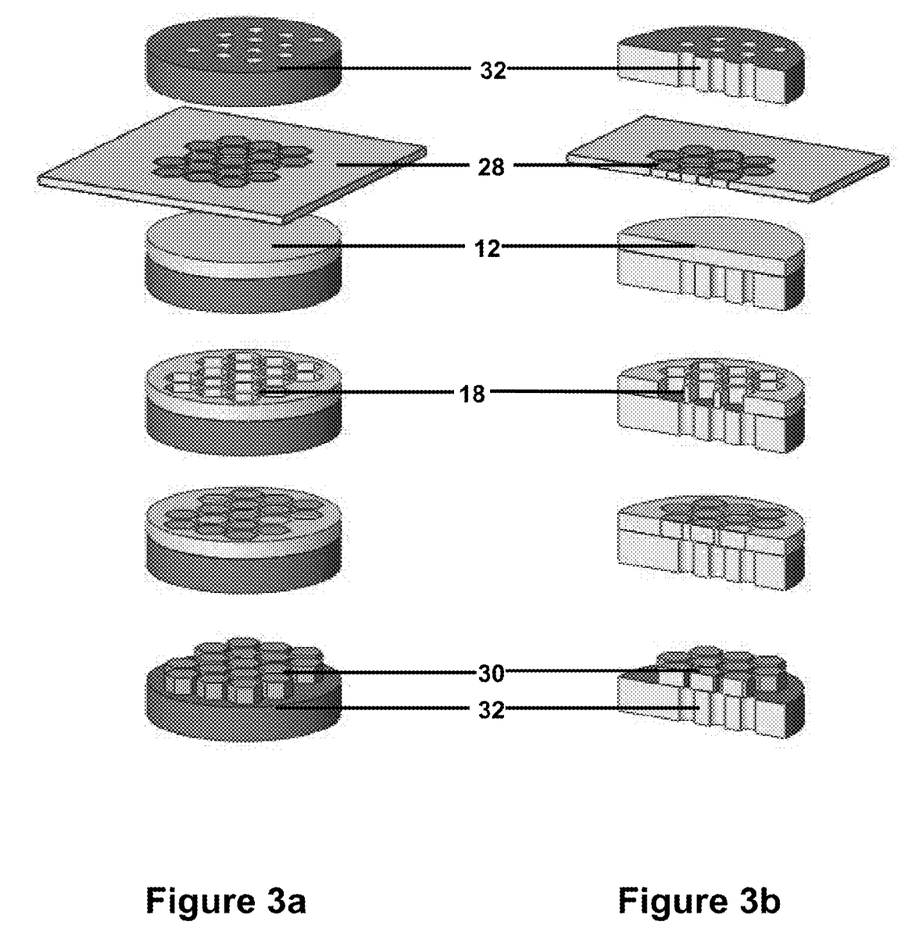
FIG. 3*a* is a schematic of the method according to one embodiment.
FIG. 3*b* is a three dimensional cross-section schematic of the embodiment shown in FIG. 3*a*.

FIG. 3a is a schematic of the method according to one embodiment, for building a hexagonal shape array of pins 30 on top of an existing hole plate 32. FIG. 3b is a three dimensional cross-section schematic of the embodiment shown in FIG. 3a. This embodiment comprises developing the non-irradiated portion of the resist layer to expose the interconnected network of resist. The resist, in this embodiment, is an organic resist and has a negative tone.

In this embodiment, a layer of a resist 12 is provided on a substrate, a hole plate 32. A mask 28 is applied to a portion of the resist after providing the layer, wherein the mask defines the pattern of the resist to be irradiated. A pattern is irradiated on the resist layer that circumscribes an interconnected network of resist and the irradiated portion of the resist layer is developed to expose the interconnected network 18 of resist. A metal layer is applied onto the surface of the substrate where the resist had been developed to form metal pins. The interconnected network of resist is removed, resulting in an interconnected series of slots defined by the metal pins 30.

Pins can be created, or grown, directly onto hole plate, for example, a hole plate that is already well characterized, with known performance in, for example, cellular ceramic extrusion. The hole plate can either be made separately or can be obtained from an existing extrusion die. After the extrusion die is used and no longer useful in manufacturing due to, for example, wear resulting in dimensional problems in a cellular ceramic product, the pin layer could be removed, for example, electrochemically or machined and the hole plate reused. This offers the advantage of shortening the processing time while using a hole plate with known performance characteristics.

Using the method as shown in FIG. 2, the pins and the hole plate can be both grown by electroplating, using a two-mask exposure. A mask is used to pattern the pin pattern, and the electroplating is carried out to make the metal pins, still attached to the substrate. Subsequently, the pins are covered with a second resist layer, which is then patterned with the a second mask with the hole pattern. A second electroplating step is then carried out using the exposed pin tops as the electrical contact. The substrate is then removed to expose the second opening of the flow path.

This way, one can grow the pins together with a thin hole plate which can be subsequently bonded to a larger hole plate. The attachment can be done for example by brazing techniques. Again, wear resistant coatings can be applied, or the plating material can have this property, as described above. Another possible approach is to grow a full hole plate right onto the pins that had been grown. With this process, a monolithic structure is obtained, not requiring bonding. In both cases, a similar approach is to first plate the hole plate followed by plating the pins, still using a two-mask approach.

To ensure best flow and pressure drop characteristics in, for example, cellular ceramic extrusion, the transition between the holes and the slots is preferably shaped such as to avoid a step change in the flow path geometry at the hole or feed plate/pin interface.

Figure 4A:
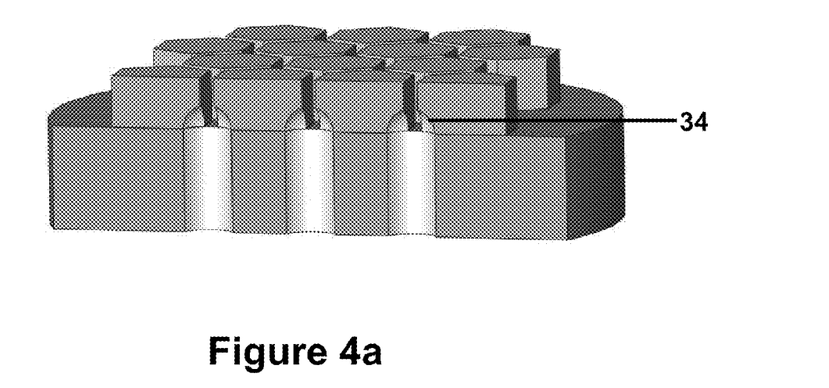
FIG. 4a is a schematic showing the transition region between the holes and slots formed according to one embodiment.
Figure 4B:
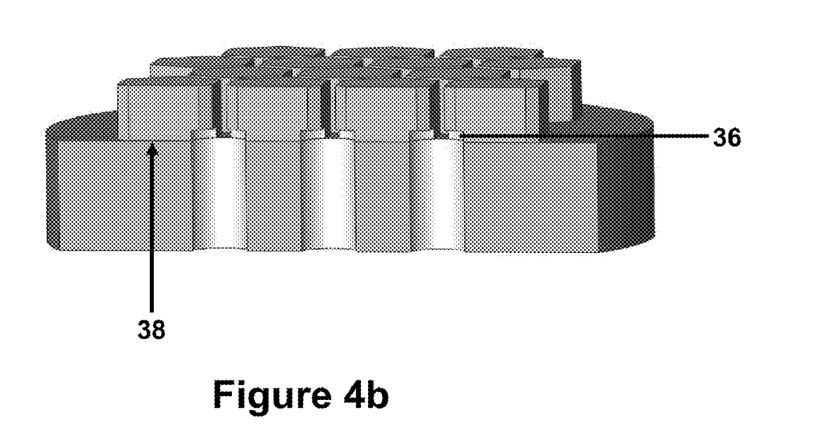
FIG. 4b is a schematic showing the transition region between the holes and slots formed according to one embodiment.

FIG. 4a and FIG. 4b each show an approach to shaping the transition region between the holes and the slots using the above described methods. FIG. 4a shows a circular shaped transition 34. In this embodiment, the entrance into the slots can be fabricated with a spherical profile, for example, by filling the holes in the hole plate with resist, pushing the resist out and reflowing the resist at the end to be electroplated, thus forming a hemisphere. The hemispherical shape can also be obtained, for example, by precision dispensing liquid drops of resist that are subsequently solidified using UV radiation. The surface to be electroplated then has metal deposited on it prior to plating.

An alternative is to use two masks to create different shapes, as shown in FIG. 4b. This moves the transition 36 between holes and slots to above the hole plate/pin interface 38. The entrance into the slots can be fabricated with an arbitrary profile, for instance by using a second mask to pattern a second layer of resist on top of the feed holes. In this example, the feed holes are extended into the pin side by patterning columns of resist then electroplating.

Figure 5A:
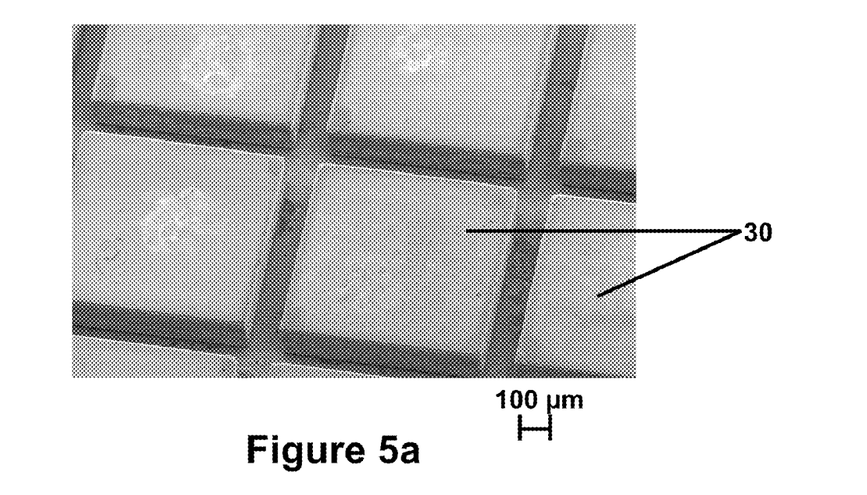
FIG. 5a is a scanning electron microscope (SEM) micrograph of square pins formed according to one embodiment of the method.
Figure 5B:
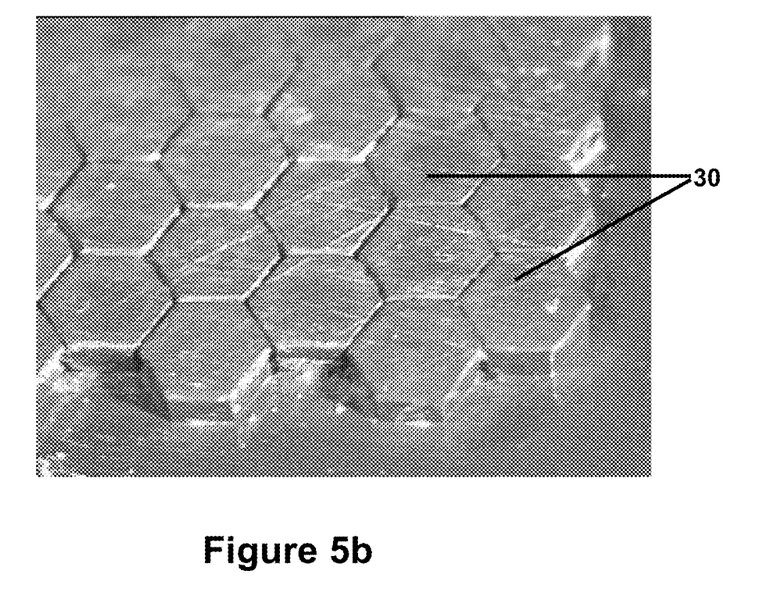
FIG. 5b is a (SEM) micrograph of hexagonal pins formed according to one embodiment of the method.

FIG. 5a and FIG. 5b are SEM micrographs of square pins and hexagonal pins, respectively, formed according to one embodiment of the method as shown in FIG. 2.

Figure 6:
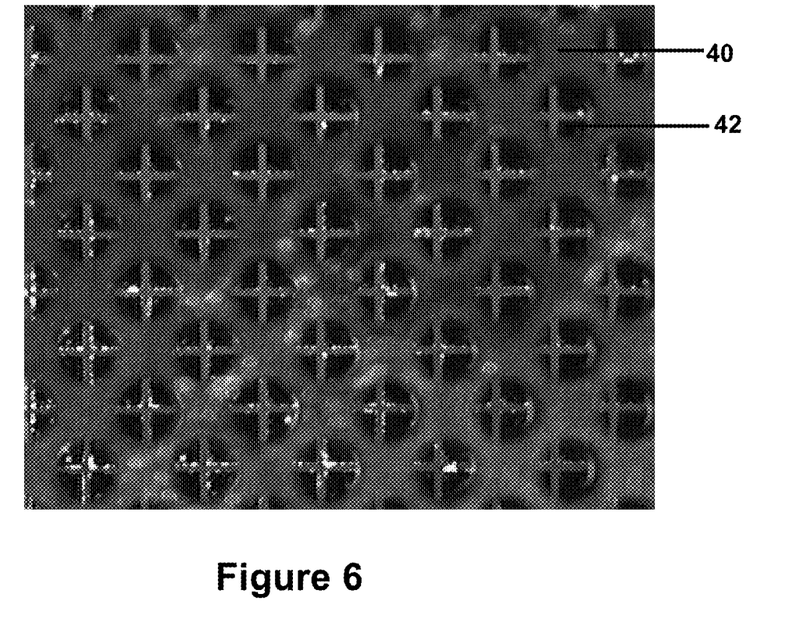
FIG. 6 shows features of an extrusion die made by the methods according to one embodiment.

FIG. 6 shows features of an extrusion die made by the methods, according to one embodiment as shown in FIG. 1 and using an existing hole plate. The photo was taken from the hole side 40 (out of focus). The pins 42 are seen in focus, on the opposite side.

Figure 7:
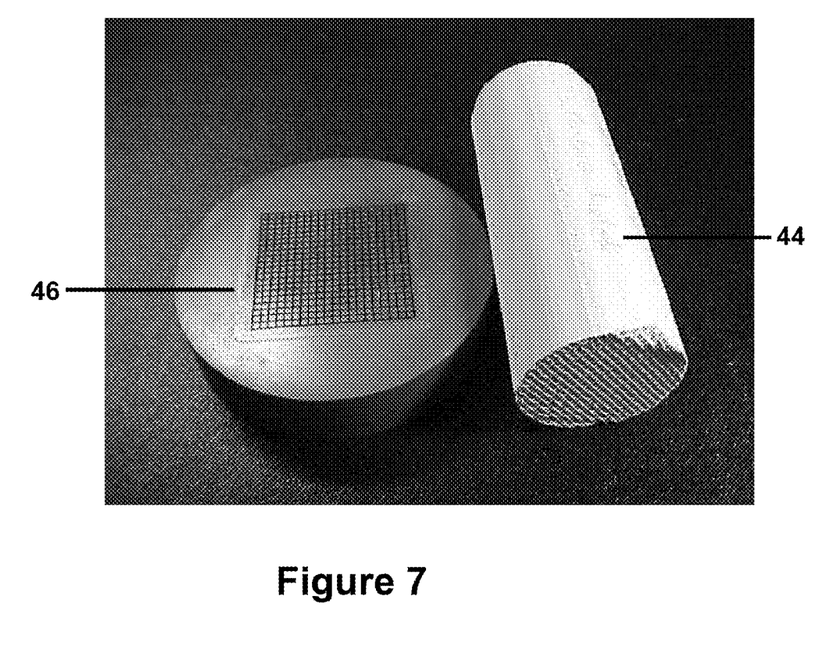
FIG. 7 shows a length of extrudate obtained by extruding through the features of the extrusion die shown in FIG. 6 and also shows the extrusion die.

FIG. 7 shows a length of extrudate 44 obtained by extruding through the features of the extrusion die shown in FIG. 6 and also shows the extrusion die 46.

The adhesion strength of the pins to the hole plate was tested during and after the die was used for extrusion. First, the pins were shown to fully survive the shearing loads during actual extrusion of an abrasive batch. A hydraulic piston ram extruder was used to extrude the batch through the die. The pressure at the die during extrusion reached 400 psi. Cordierite, for example, a material used to make cellular ceramic products available from Corning Incorporated, was extruded and a fully knitted extrudate was produced as shown in FIG. 7. Second, the pins were shown to fully survive the more harsh conditions during high-pressure washing of the die, after extrusion. The die was washed after extrusion at 3500 psi (pins up/pins down) with no pin adhesion failure.

Methods of making extrusion dies as described herein have one or more of the following advantages: a complete freedom in choosing the shape of the pin and pin pattern geometry, thus the overall definition of the extrudate cross-section, cellular or not and the potential of a faster manufacturing cycle. Since dies are made by building up metal inside precision cells made by lithography, rather than locally obliterating metal by spark erosion (EDM), very small dimensions with high precision tolerances for slot width and slot width uniformity can be obtained. Complex shapes can be created, through a full 2D freedom of pattern choice. The use of lithography offers the ability to freely choose any slot layout for the die. Existing hole plates can be used having predictable performance while lowering manufacturing costs. Further, a variety of metals can be electroplated with improved wear and corrosion characteristics.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A method for making an extrusion die, the method comprising:
   providing a layer of a resist on a hole plate;
   irradiating a pattern on the resist layer that circumscribes an interconnected network of resist;
   developing the resist layer to expose the interconnected network of resist;
   applying a metal layer onto the surface of the hole plate where the resist had been developed to form metal pins; and
   removing the interconnected network of resist, resulting in an interconnected series of slots defined by the metal pins to form the extrusion die.

2. The method according to claim 1, wherein the resist is selected from an organic resist, inorganic resist, and combinations thereof.

3. The method according to claim 1, wherein the organic resist is selected from a photo resist, a polymer resist, and combinations thereof.

4. The method according to claim 1, which comprises developing the irradiated portion of the resist layer to expose the interconnected network of resist.

5. The method according to claim 1, which comprises developing the non-irradiated portion of the resist layer to expose the interconnected network of resist.

6. The method according to claim 1, which comprises applying the metal layer at a thickness equal to that of the resist layer.

7. The method according to claim 1, which comprises applying the metal layer at a thickness greater than that of the resist layer.

8. The method according to claim 1, which comprises applying the metal layer through plating.

9. The method according to claim 8, wherein the plating is selected from electroplating and electroless plating.

10. The method according to claim 8, wherein the plating material is selected from Ni, Ni—P, Ni—B, Al, Ni—Co, Ni—Mn, Ni—Mn—Co, Au, Cu, Cr, filled materials, a filled fluorocarbon and combinations thereof.

11. The method according to claim 10, wherein the filler material is selected from carbon nitride, a carbide compound, silicon carbide, tungsten carbide and combinations thereof.

12. The method according to claim 1, further comprising applying a mask to a portion of the resist after providing the layer, wherein the mask defines the pattern of the resist to be irradiated.

13. The method according to claim 12, comprising irradiating the mask and the layer of resist.

14. The method according to claim 13, further comprising removing the mask prior to developing.

15. The method according to claim 1, which comprises irradiating by radiation selected from ultra-violet, electron beam, ion beam, proton beam, electromagnetic radiation, X-ray, laser, and combinations thereof.

16. The method according to claim 1, further comprising coating the metal layer with a wear resistant coating.

17. The method according to claim 1, wherein the interconnected network of resist is removed by a process selected from chemical stripping, pyrolysis, molten salt, and combinations thereof.

* * * * *